(12) United States Patent
Ward et al.

(10) Patent No.: US 7,601,953 B2
(45) Date of Patent: Oct. 13, 2009

(54) SYSTEMS AND METHODS FOR A GAS FIELD ION MICROSCOPE

(75) Inventors: Billy W. Ward, Merrimac, MA (US); Louis S. Farkas, III, Durham, NH (US); John A. Notte, IV, Gloucester, MA (US); Randall G. Percival, Raymond, NH (US)

(73) Assignee: ALIS Corporation, Peabody, MA (US)

( * ) Notice: Subject to any disclaimer, the term of this patent is extended or adjusted under 35 U.S.C. 154(b) by 47 days.

(21) Appl. No.: 11/385,215

(22) Filed: Mar. 20, 2006

(65) Prior Publication Data

US 2007/0215802 A1    Sep. 20, 2007

(51) Int. Cl.
*H01J 37/26* (2006.01)
(52) U.S. Cl. ...................................................... 250/309
(58) Field of Classification Search ................. 250/309, 250/423 R, 424, 425, 423 F, 492.21
See application file for complete search history.

(56) References Cited

U.S. PATENT DOCUMENTS

| | | | |
|---|---|---|---|
| 2,893,624 A | 7/1959 | Fricke | |
| 3,121,155 A | 2/1964 | Berry | |
| 3,602,710 A | 8/1971 | Mueller | |
| 3,868,507 A | 2/1975 | Panitz | |
| 4,044,255 A | 8/1977 | Krisch et al. | |
| 4,139,773 A | 2/1979 | Swanson | |
| 4,236,073 A | 11/1980 | Martin | |
| 4,255,661 A * | 3/1981 | Liebl | 250/396 R |
| 4,352,985 A | 10/1982 | Martin | |
| 4,451,737 A | 5/1984 | Isakozawa | |
| 4,467,240 A * | 8/1984 | Futamoto et al. | 313/336 |
| 4,633,084 A | 12/1986 | Gruen et al. | |
| 4,638,209 A * | 1/1987 | Asamaki et al. | 313/359.1 |
| 4,639,307 A | 1/1987 | Goodrich | |
| 4,649,316 A | 3/1987 | Cleaver et al. | |
| 4,721,878 A | 1/1988 | Hagiwara et al. | |
| 4,785,177 A | 11/1988 | Besocke | |
| 4,874,947 A | 10/1989 | Ward et al. | |
| 4,954,711 A | 9/1990 | Fink et al. | |
| 4,983,540 A | 1/1991 | Yamaguchi et al. | |

(Continued)

FOREIGN PATENT DOCUMENTS

DE    197 15 226 A    10/1998

(Continued)

OTHER PUBLICATIONS

Fink, H.-W., "Mono-atomic tips for scanning tunneling microscopy", IBM J. Res. Develop. 30: 460-465 (1986).

(Continued)

*Primary Examiner*—Kiet T Nguyen
(74) *Attorney, Agent, or Firm*—Fish & Richardson P.C.

(57) ABSTRACT

In one aspect the invention provides a gas field ion microscope that includes an ion source in connection with an optical column, such that an ion beam generated at the ion source travels through the optical column and impinges on a sample. The ion source includes an emitter having a width that tapers to a tip comprising a few atoms. In other aspects, the invention provides methods for using the ion microscope to analyze samples and enhancing the performance of a gas field ion source.

19 Claims, 8 Drawing Sheets

U.S. PATENT DOCUMENTS

| | | | |
|---|---|---|---|
| 4,985,634 A | 1/1991 | Stengl et al. | |
| 5,034,612 A | 7/1991 | Ward et al. | |
| 5,059,785 A * | 10/1991 | Doyle et al. | 250/309 |
| 5,063,294 A * | 11/1991 | Kawata et al. | 250/309 |
| 5,083,033 A | 1/1992 | Komano et al. | |
| 5,151,594 A | 9/1992 | McClelland | |
| 5,188,705 A | 2/1993 | Swanson et al. | |
| 5,324,950 A | 6/1994 | Otaka et al. | |
| 5,414,261 A | 5/1995 | Ellisman et al. | |
| 5,574,280 A | 11/1996 | Fujii et al. | |
| 5,750,990 A | 5/1998 | Mizuno et al. | |
| 5,783,830 A | 7/1998 | Hirose et al. | |
| 5,976,390 A | 11/1999 | Muramatsu | |
| 6,028,953 A | 2/2000 | Nakamura et al. | |
| 6,042,738 A | 3/2000 | Casey et al. | |
| 6,211,527 B1 | 4/2001 | Chandler | |
| 6,268,608 B1 | 7/2001 | Chandler | |
| 6,354,438 B1 | 3/2002 | Lee et al. | |
| 6,395,347 B1 | 5/2002 | Adachi et al. | |
| 6,414,307 B1 | 7/2002 | Gerlach et al. | |
| 6,504,151 B1 | 1/2003 | Mitchell et al. | |
| 6,538,254 B1 | 3/2003 | Tomimatsu et al. | |
| 6,579,665 B2 | 6/2003 | Lee et al. | |
| 6,581,023 B1 | 6/2003 | Kim | |
| 6,700,122 B2 | 3/2004 | Matsui et al. | |
| 6,753,535 B2 | 6/2004 | Rose | |
| 6,791,084 B2 | 9/2004 | Shimoma et al. | |
| 6,822,245 B2 | 11/2004 | Muto et al. | |
| 6,875,981 B2 | 4/2005 | Nishikawa | |
| 7,084,399 B2 | 8/2006 | Muto et al. | |
| 7,119,333 B2 * | 10/2006 | Herschbein et al. | 250/309 |
| 7,230,244 B2 * | 6/2007 | Trotz et al. | 250/339.12 |
| 7,368,727 B2 * | 5/2008 | Ward | 250/423 R |
| 2002/0134949 A1 | 9/2002 | Gerlach et al. | |
| 2002/0144892 A1 | 10/2002 | Lee et al. | |
| 2002/0170675 A1 | 11/2002 | Libby et al. | |
| 2003/0047691 A1 | 3/2003 | Musil et al. | |
| 2003/0062487 A1 | 4/2003 | Hiroi et al. | |
| 2003/0174879 A1 | 9/2003 | Chen | |
| 2004/0031936 A1 | 2/2004 | Oi et al. | |
| 2004/0121069 A1 | 6/2004 | Ferranti et al. | |
| 2005/0045821 A1 | 3/2005 | Noji et al. | |
| 2006/0060777 A1 | 3/2006 | Motoi et al. | |
| 2006/0097166 A1 | 5/2006 | Ishitani et al. | |
| 2006/0197017 A1 | 9/2006 | Motoi et al. | |
| 2007/0025907 A1 | 2/2007 | Rezeq et al. | |
| 2007/0051900 A1 * | 3/2007 | Ward | 250/423 R |

FOREIGN PATENT DOCUMENTS

| | | | |
|---|---|---|---|
| DE | 197 44 126 A | 4/1999 | |
| EP | 0 317 952 | 5/1989 | |
| EP | 0 427 532 | 5/1991 | |
| EP | 0 477 992 A2 | 4/1992 | |
| EP | 1 491 654 | 12/2004 | |
| EP | 1 655 265 | 5/2006 | |
| FR | 2244257 A | 4/1975 | |
| GB | 1 604 898 | 12/1981 | |
| JP | 63 045740 | 2/1888 | |
| JP | 5209844 | 12/1983 | |
| JP | 62 051134 | 3/1987 | |
| JP | 63 040241 A | 2/1988 | |
| JP | 63 045740 | 2/1988 | |
| JP | 63 200434 | 8/1988 | |
| JP | 1-130450 | 5/1989 | |
| JP | 02 087440 | 3/1990 | |
| JP | 04 341734 | 11/1992 | |
| JP | 04 341743 | 11/1992 | |
| JP | 5275050 | 10/1993 | |
| JP | 07045230 | 2/1995 | |
| JP | 2789610 | 8/1995 | |
| JP | 2001 176440 | 6/2001 | |
| JP | 02 025488 | 1/2002 | |
| JP | 2003 302579 A | 10/2003 | |
| WO | 98/47172 | 10/1998 | |
| WO | 01/04611 | 1/2001 | |
| WO | WO 2004/015496 | 2/2004 | |
| WO | 2004/068538 | 8/2004 | |
| WO | 2006/133241 | 12/2006 | |

OTHER PUBLICATIONS

Fink, H.-W., "Point Source for Ions and Electrons", Physica Scripta 38: 260-263 (1988).

Binh, V.T., "In situ fabrication and regeneration of microtips for scanning tunneling microscopy", J. Microscopy 152(2): 355-361 (1988).

Stocker, W. et al., "Low-energy electron and ion projection microscopy", Ultramicroscopy 31: 379-384 (1989).

Bell, A.E. et al., "High-field ion sources", Rev. Sci. Instrum. 61(1): 363-365 (1990).

Schmid, H. et al., "Combined electron and ion projection microscopy", Appl. Surf. Sci. 67: 436-443 (1993).

Muller, H.U. et al., "Emission properties of electron point sources", Ultramicroscopy 50: 57-64 (1993).

Horch, S. et al., "Field emission from atomic size sources", J. Appl. Phys. 74(6): 3652-3657 (1993).

Fink, H.-W. et al., "Electron and Ion Microscopy Without Lenses", Nanostructures and Quantum Effects (Springer-Verlag, 1994), pp. 17-27.

Edinger, K. et al., "Development of a high brightness gas field ion source", J. Vac. Sci. Technol. B 15(6): 2365-2368 (1997).

Horiuchi, K. et al., "Emission characteristics and stability of a helium field ion source", J. Vac. Sci. Technol. B. 6(3): 937-940 (1988).

Melngailis, J., "Focused ion beam technology and applications", J. Vac. Sci. Technol. B 5(2): 469-495 (1987).

Fu, T.-Y. et al., "Method of creating a Pd-covered single-atom sharp W pyramidal tip: Mechanism and energetics of its formation", Phys. Rev. B 64: 113401-1-4 (2001).

Lucier, A.-S., "Preparation and Characterization of Tungsten Tips Suitable for Molecular Electronics Studies", excerpts from MSc Thesis, McGill University, 2004.

Fotino, M., "Tip sharpening by normal and reverse electrochemical etching", Rev. Sci. Instrum. 64(1): 159-167 (1993).

Wengelnik, H. et al., "Oxygen-induced sharpening process of W(111) tips for scanning tunneling microscope use," J. Vac. Sci. Technol. A 8(1): 438-440 (1990).

Rezeq, M. et al., "Sharpening of a Field of Ion Microscope (FIM) Tungsten Tip by the Controlled Interation of Nitrogen with the Tip Surface Atoms," Abastract from APS March Meeting (2004).

McGuinness, P.E., "Seeing at Atomic Resolution is Believing: Welcome the Helium Ion Microscope", Scanning 27(6): 323 (2005).

Notte, J. et al., "Sample Interaction and Contrast Mechanisms of the Helium Ion Microscope" (Scanning Conference, Apr. 2006).

Notte, J.A. et al., "An Introduction to Helium Ion Microscopy and its Nanotechnology Applications" (NanoScience and Technology Institute, May 2006).

Ward, B.W. et al., "The Helium Ion Microscope: A New Tool for Nanoscale Microscopy and Metrology" (Electron, Ion, and Photon Beam Nanotechnology Conference, May 2006).

Morgan, J. et al., "An Introduction to the Helium Ion Microscope" (Microscopy Today, Jul. 2006).

Hill, R. et al., "The ALIS He Ion Source and its Application to High Resolution Microscopy" (Seventh International Conference on Charged Particle Optics, Jul. 2006).

Notte, J. et al., "An Introduction to Helium Ion Microscopy" (Microscopy and Micro-Analysis, Jul. 2006).

"An Introduction to the Helium Ion Microscope" (Materials Research Society Meeting, Nov. 2006).

J. Melngailis, "Ion Sources for Nanofabrication & High Resolution Lithography," IEEE Proceedings of the 2001 Particle Accelerator Conference, Chicago, Illinoise, (2002).

K. Jousten et al. "Growth & Current Charities of a Stable field Ion Emitter," Ultramicroscope 26, pp. 301-312 (1988).

Qing Ji, "Maskless, Resistless Ion Beam Lithography Process," Ph.D. Dissertation, Department of Electrical Engineering and Computer Sciences, UCAL Berkeley (2003).

Escovitz et al., "Scanning Transmission Ion Microscope with a Field Ion Source," Feb. 24, 1975, Proceedings of the National Academy of the Sciences, vol. 72, No. 5, Published May 1975, pp. 1826-1828.

Russell P.E. et al., "Chemically and geometrically enhanced focused ion beam micromachining," Journal of Vacuum Science and Tehcnology B, vol. 16, No. 4, Jul./Aug. 1998, 2494-2498.

Schmid et al., "In-line holography using low-energy electrons and photons: Applications for manipulation on a nanometer scale," Journal of Vacuum Science & Technology B: Microelectronics and Nanometer Structures, Nov. 1995, vol. 13, Issue 6, pp. 2428-2431.

Fink et al., "Atomic Resolution in Lensless Low-energy Electron Holography," Phys. Rev. Lett. 67, Issue 12-16 Sep. 1991, pp. 1543-1546.

Brune et al., "Surface migration of "hot" adatoms in the course of dissociative chemisorption of oxygen on Al(111)," Phys. Rev. Lett. 68, Issue 5-3 Feb. 1992, pp. 624-626.

Fink et al., "Lattice Steps and Adatom Binding on Tungsten (211)," Surf. Sci., vol. 143, No. 1, pp. 125-144, Jul. 1984.

Schmid et al., "Mechanical and electronic manipulation of nanometer-sized wires," Nanotechnology, vol. 5, pp. 26-32, 1994.

Fink et al., "Coherent point source electron beams," Journal of Vacuum Science & Technology B: Microelectronics and Nanometer Structures, Nov. 1990, vol. 8, Issue 6, pp. 1323-1324.

Purcell et al., "Characterization of atomic-size metal ion sources," Journal of Vacuum Science & Technology B: Microelectronics and Nanometer Structures, Jan. 2001, vol. 19, Issue 1, pp. 79-86.

Thompson et al., "Towards a commercial gas field ion source," Proceedings of SPIE, vol. 2437.

Wilbertz et al., "Recent Progress in gas field ion source technology," Proceeding of SPIE, vol. 2194.

Mutsaers, "Nuclear Microprobe Design," Nuclear Instruments & Methods in Physics Research Section-B: Beam Interactions with Materials and Atoms, Elsevier, Amsterdam, NL, vol. 113, No. 1, Jun. 1996, pp. 323-329.

Jaksic et al., "New Developments in IBIC for the Study of Change Transport Properties of Radiation Detector Materials," Nuclear Instruments & Methods in Physics Research, Section-B: Beam Interactions with Materials and Atoms, Elsevier, Amsterdam, NL, vol. 158, No. 1-4, Sep. 2, 1999, pp. 458-463.

Butz et al., "From Micro- to Nanoprobes: Auspices and Horizons," Nuclear Intruments & Methods in Physics Research, Section-B: Beam Interactions with Materials and Atoms, Elsevier, Amsterdam, NL, vol. 113, No. 1, Jun. 1996, pp. 317-322.

Tondare V. N., "Quest for high brightness, monochromatic noble gas ion sources," J.Vac.Sci.Technol., A 23, 1498 (2005).

Grivet et al., "Ion Microscopy: History and Actual Trends," Ann NY Acad Sci, 1978 NY Acad of Sci, vol. 306, Feb. 23, 1977, pp. 158-182.

Magnan, "The Proton Microscope," Nucleonics, vol. 4, No. 4, Apr. 1949, pp. 52-66.

Chanson et al., "Sur les premieres images obtenues avec un microscope protonique," Comptes Rendus Hebdomadaires des Seances de l'Academie des Sciences France, vol. 233, Dec. 3, 1951, pp. 1436-1438.

Knoll et al., "Das Elektronenmikroskop" Zeitshrift fur Physik Germany, vol. 78, No. 5-6, Oct. 4, 1932, pp. 318-339.

Breese et al., "Ion optical study of a transmission ion microscope," Muclear instruments & Methods in Physics Research, Section-B: Beam Interactions with Materials and Atoms, Elsevier, Amsterdam, NL, vol. 158, No. 1-4, Sep. 2, 1999, pp. 236-240.

Valdiviez et al., "The mechanical design of a proton microscope for radiography at 800 MeV,"Institute of Electrical and Electronics Engineers: Proceedings of the 2003 Particle Accelerator Conference. PAC 2003. Portland, OR, May 12-16, 2003, Particle Accelerator Conference, New York, NY: IEEE, US. vol. 1 of 5, May 12, 2003.

Bunday et al., "Determination of optimal parameters for CD-SEM measurement of line-edge roughness," Metrology, Inspection, and Process Control for Microlithography XVIII, Proceedings of SPIE—The International Society for Optical Engineering, vol. 5375, pp. 515-533, May 24, 2004.

Hong-Shi et al., "Preparation and characterization of single-atom tips," Nano Letters, vol. 4, No. 12, pp. 2379-2382, Dec. 2004.

Itakura et al., "Focusing Column For Helium Field Ion Source," Microelectric Engineering, Elsevier Publishers BV., Amsterdam, NL, vol. 3, No. 1-4, pp. 153-160, Sep. 23, 1985.

Itakura et al., "Microprobe of Helium Ions," Journal of Vacuum Science and Technology: Part B, AVS / AIP, Melville, New York, NY, vol. 9, No. 5, pp. 2596-2601, Sep. 1, 1991.

Kalbitzer et al., "High-brightness source for ion and electron beams (invited)," Review of Scientific Instruments, American Institute of Physics, vol. 69, No. 2, pp. 1026-1031, Feb. 2, 1998.

Kalbitzer et al., "Ion beam modification for submicron technology," Nuclear Instruments & Methods in Physics Research, Section-B: Beam Interactions With Materials and Atoms, Elsevier, Amsterdam, NL, vol. 113, No. 1, pp. 154-160, Jun. 1996.

Kalbitzer et al., "Multipurpose nanobeam source with supertip emitter," Journal of Vacuum Science & Technology B: Microelectronics Processing and Phenomena, American Vacuum Society, vol. 16, No. 4, pp. 2455-2461, Jul. 1998.

Kalbitzer, "Bright ion beams for the nuclear microprobe," Nuclear Instruments & Methods In Physics Research, Section-B: Beam Interactions With Materials And Atoms, Elsevier, Amsterdam, NL., vol. 158, No. 1-4, pp. 53-60, Sep. 2, 1999.

Kim et al., "Effects of low-energy (1-1.5 kV) nitrogen-ion bombardment on sharply pointed tips: Sputtering, implantation, and metalnitride formation," Journal of Applied Physics, American Institute of Physics, vol. 81, No. 2, p. 944, Jan. 15, 1997.

Levi-Setti, "High Resolution Scanning Ion Probes: Application to Physics and Biology," Nuclear Instruments and Methods, North-Holland, vol. 168, No. 1-3, pp. 139-149, Jun. 25, 1979.

Levi-Setti, "Proton Scanning Microscopy: Feasibility and Promise," Scanning Electon Microscopy. Proceedings of The Annual Scanning Electron Microscope Symposium, Chicago, IL., pp. 125-134, Apr. 11, 1974.

Liu et al., "A Study of Optical Properties of Gas Phase Field Ionization Sources," Advances in Imagin and Electron Physics, Elsevier Academic Press, vol. 138, pp. 147-175, Oct. 2005.

Orloff et al., "A Scanning Ion Microscope with A Field Ionization Source," Scanning Electron Microscopy. Proceedings of The Annual Scanning Electron Microscope Symposium, Chicago, IL, No. 10, pp. 57-62, Mar. 1977.

Orloff et al., "High-Resolution Focused Ion Beams: FIB and its Applications," Kluwer Academic / Plenum Publishers, New York, Chapter 6.8, (2003).

Orloff, "High-Resolution Focused Ion Beams," Review of Scientific Instruments, AIP, vol. 64, No. 5, pp. 1106-1107, May 1, 1993.

Stevie et al., "Focused Ion Beam Gases for Deposition and Enhanced Etch," Chapter 3 of Introduction to Focused Ion Beams—Instrumentation, Theory, Techniques and Practice, Edited by Giannuzi et al., Published by Springer, pp. 53-72, (2005).

Tondare et al., "The concept of a high-brightness, miniaturized gas field ion source," Vacuum Microelectronics Conference, 2003. Technical Digest of the 16th International IEEE, pp. 307-308, Jul. 7, 2003.

Wolf et al., "Design and performance of a scanning probe-hole field emission microscope," Surface Science, vol. 246, No. 1-3, pp. 420-427, Apr. 1991.

Bernatskii and Pavlov, "Field Desorption of a Potassium-Gold Film on Tungsten," Physics of the Solid State, 46(8):1538-1541, 2004.

Boerret et al., "Long time current stability of a gas filed ion source with a supertip," J. Phys. D. Appl. Phys. 21(12):1835-1837, 1988.

Giannuzzi and Stevie, Introduction to Focused Ion Beams—Instrumentation, Theory, Techniques and Practice, Nov. 2004, Springer, XP002442742, Chapter 3, see especially p. 56, second section.

Giannuzzi and Stevie, Introduction to Focused Ion Beams—Instrumentation, Theory, Techniques and Practice, Nov. 2004, Springer, XP002462691, Chapter 5—Device Edits and Modifications.

Golubev et al., "Field Emission Study of the Growth of Close-Packed and Stepped Surfaces of a Tungsten Single Crystal," J. Crystal Growth 52:48-52, 1981.

Hiroshima et al., "A focused He+ ion beam with a high angular current density," Jpn. J. Appl Phys., 31(1)(12B):4492-4495, 1992.

Kuo et al., "Noble Metal/W(111) Single-Atom Tips and Their Field Electron and Ion Emission Characteristics," Jpn. J. App. Phy., 45(11):8972-8983, 2006.

Kubena et al., "A low magnification focused ion beam system with 8 nm spot size," J. Vac. Sci. Technol., 9(6):3079-3083, 1991.

Lui and Orloff, "Analytical model of a gas phase filed ionization source," J. Vac. Sci. Technol. B 23(6):2816-2820, 2005.

Melngailis, "Focused ion beam Lithography", Nuclear Instr. And Methods in Phys. Res. B80(81):1271-1280, 1993.

Pavlov, "Atomically Sharp 21 111> Trihedral Angle of a Tungsten Tip," Physics of a Solid State, 49(8):1579-1582, 2007.

Pavlov, "Field-Desorption Microscopy Study of the Deformation of a Tungsten Tip Subjected to Thermal Treatment in an Electric Field," Physics of the Solid State, 47(11):2180-2185, 2005.

Pavlov, "Field Desorption Microscopy of the <111> Trihedral Angle of a Reconstructed Tungsten Tip," Technical Physics, 51(9):1210-1214, 2006.

Pavlov, "Observation of the Drawing out of Needles by Electric Fields," A translation of JETP Pis'ma v Redaktsiyu of the Academy of Sciences of the USSR, 17(5):177-179, 1973.

Pavlov, "Variations in Shapes of Outgrowths on a Tungsten Tip during Growth in an Electric Field," Physics of a Solid State, 48(5):969-972, 2006.

Sakai et al., "Contrast mechanisms in scanning ion microscope imaging for metals," App. Phys. Letters, AIP, vol. 73, No. 5, pp. 611-613, Aug. 3, 1998.

Sakata et al., "Helium field ion source for application in a 100 keV focused ion beam system," J. Vac. Sci. Technol. B 10(6):2842-2845, 1992.

Sendecki and Barwinski, "A scanning field emission microscope," Meas. Sci. Technol., 6(3):306-309, (1995).

Shrednik et al., "Growth of Tips in the Directions Normal to Close-Packed Faces by Heating in the Presence of an Electric Field," Phys. Stat. Sol. (a), 23(1):373-381, 1974.

Unger et al., "Probe hole field electron/field ion microscopy and energy spectroscopy of ultrasharp [111]-oriented tungsten tips," Applied Surface Science 87(88):45-52, 1995.

Vlasov et al., "High-temperature filed evaporation of thermofield microscopic protuberances," Sov. Tech. Phys. Lett. 12(5):224-225, 1986.

Ward et al., "Focused Ion Beam Induced Optical Emission Spectroscopy," J. Vac. Sci. Technol. 6(6):2100-2103, 1988.

Nova 600 Nanolab Product Data, Fei Company Product Data, 2003, XP007903648.

Breguet and Clavel, "Stick and Slip Actuators: design, control, performances and applications," Micromechatronics and Human Science, Proceedings of the 1998 International Symposium, 89-95, 1998.

Fu et al., "Microfabrication of microlens array by focused ion beam technology," Microelectronic Engineering, 54(3-4):211-221, 2000.

Liu and Wang, "A self-moving precision positioning stage utilizing impact force of spring-mounted piezoelectric actuator," Sensors and Actuators, 102(1-2):83-92, 2002.

Nomura et al., "Application of Electromagnetic Actuator using Rubber Film to Three-Degrees-of-Freedom Precision Stage," Advanced Intelligent Mechatronics (AIM 2003), 101-106, 2003.

Orloff et al., "High Resolution Focused Ion Beams: FIB and its Applications," Review of Scientific Instruments, 136-145, 2003.

Orloff et al, "Fundamental limits to imaging resolution for focused ion beams," J. Vacuum Science & Tech., 14(6):3759-3763, 1996.

Versteyhe et al., "A rigid and accurate piezo-stepper based on smooth learning hybrid force-position controlled clamping," Proceedings of the 1998 IEEE International Conference on Robotics & Automation, 4:3059-3064, 1998.

* cited by examiner

SYSTEMS AND METHODS FOR A GAS FIELD ION MICROSCOPE

BACKGROUND

There are typically two types of charged particle microscopes: The SEM (scanning electron microscope) and the FIB (focused ion beam). The commercially viable FIBs have been based upon the gallium LMIS (liquid metal ion source). In general the SEMs offer better resolution than FIBs and cause no damage to the sample being imaged. FIB's typically damage the sample due to the high mass of the incident ion, and the persistence of the implanted ion.

There is a need for a microscope having a reliable and bright ion source. Such a source incorporated into an ion electro-optical system will provide very high resolution pictures having near atom resolution.

SUMMARY OF THE INVENTION

The recently developed ALIS gas field ionization source permits the creation of a new type of FIB, the Helium Ion Microscope. The ALIS type of Helium Ion Microscope offers several advantages over both the existing SEMs and the existing FIBs. First, the mass of the helium ion is typically small enough that it causes no sample damage (unlike the traditional FIB), yet it is large enough that diffraction effects do not severely impact resolution (unlike the traditional SEM). Also, the contrast mechanisms of the helium ion beam offers superior voltage contrast, channeling contrast, and material contrast compared to a traditional FIB or SEM. Additionally, the beam can be focused to a smaller spot than a traditional SEM by virtue of the reduced diffraction effects, low energy spread, and small virtual source size. Upon impact with the sample, the excited region tends to be smaller than the region excited by the SEM, hence the image can be substantially sharper.

The systems and methods described herein include an improved gas field ion microscope and improved methods for analyzing samples using the gas field ion microscope. This application is related to U.S. patent applications Ser. No. 10/966,243 filed on Oct. 15, 2004, Ser. No. 11/146,741 filed on Jun. 7, 2005, Ser. No. 11/147,102 filed on Jun. 7, 2005, now U.S. Pat. No. 7,321,118, and U.S. Provisional Application 60/741,956 filed on Dec. 2, 2005. This application also relates to U.S. application Ser. No. 11/385,136 filed on Mar. 20, 2006, entitled "Systems and Methods for a Gas Field Ionization Source." The entire contents of each of the above references are incorporated herein by reference.

In one aspect the invention provides a gas field ion microscope that includes an ion source in connection with an optical column, such that an ion beam generated at the ion source travels through the optical column and impinges on a sample. The ion source includes an emitter having a width that tapers to a tip comprising a few atoms. In other aspects, the invention provides methods for using the ion microscope to analyze samples and enhancing the performance of a gas field ion source.

More particularly, in one aspect, the systems and methods described herein include an ion microscope. The ion microscope comprises an ion source, capable of generating an ion beam, having a distal end that tapers to an atomic shelf including a substantially constant predetermined number of atoms. The ion microscope also comprises a sample holder for securing a sample and physically separated from the distal end of the ion source. The ion microscope further comprises a detector for detecting particles emitted from the sample in response to the ion beam and an optical column extending from the ion source towards the sample.

In one embodiment, the ion microscope may comprise a gas source capable of delivering a gas to a region near the distal end of the ion source. The gas source may deliver gas at a predetermined pressure. The gas source may include an input module capable of receiving instructions to change the predetermined pressure.

In one embodiment, the ion microscope may comprise a conversion plate disposed near the sample holder such that the particles emitted from the sample strike a portion of the conversion plate. The conversion plate may be capable of emitting a second set of particles in response to the particles emitted from the sample.

In one embodiment, the distance from an end of the optical column to the sample is greater than 50 mm. The optical column may include electrodes placed at one or more locations between the distal end of the emitter and the sample such that the particle beam may be accelerated and/or decelerated.

In another aspect, the systems and methods described herein include methods for analyzing a sample using an ion microscope. The methods include the step of providing an ion microscope comprising an ion source, capable of generating an ion beam, having a distal end that tapers to an atomic shelf including a substantially constant predetermined number of atoms. The ion microscope further comprises a sample holder for securing a sample and physically separated from the distal end of the ion source, a detector, for detecting particles emitted from the sample in response to the ion beam and an optical column extending from the ion source towards the sample. The methods further include the steps of securing the sample to the sample holder, operating the ion microscope, such that the ion beam strikes a portion of a surface of the sample, and detecting particles emitted from the sample in response to the ion beam.

In one embodiment, the ion microscope further comprises a gas source for delivering a gas to a region near the distal end of the ion source. In such an embodiment, the intensity of the ion beam may be adjusted based at least in part on a concentration of gas in the region near the distal end of the ion source. In one embodiment, the ion beam may be accelerated and/or decelerated.

In one embodiment, the step of detecting particles includes detecting a characteristic of particles emitted from the sample. The characteristic may include at least one of number of particles, particle energy, particle angles, particle polarization and de-excitation time. The particles emitted from the sample may include at least on of photons, electrons, ionized particles and neutral particles.

In one embodiment, the ion microscope comprises a conversion plate disposed near the sample holder. The step of detecting particles further includes detecting a second set of particles emitted from the conversion plate such that a characteristic of particles emitted from the sample in response to the ion beam is modified.

BRIEF DESCRIPTION OF THE DRAWINGS

The following figures depict certain illustrative embodiments of the invention in which like reference numerals refer to like elements. These depicted embodiments may not be drawn to scale and are to be understood as illustrative of the invention and not as limiting in any way.

DETAILED DESCRIPTION OF CERTAIN ILLUSTRATED EMBODIMENTS

There are other aspects and embodiments of the systems and methods of the invention will be described more fully by referring to the figures provided.

The systems and methods described herein will now be described with reference to certain illustrative embodiments. However, the invention is not to be limited to these illustrated embodiments which are provided merely for the purpose of describing the systems and methods of the invention and are not to be understood as limiting in anyway.

As will be seen from the following description, in one aspect the invention provides a gas field ion microscope that includes an ion source in connection with an optical column, such that an ion beam generated at the ion source travels through the optical column and impinges on a sample. The ion source includes an emitter having a width that tapers to a tip comprising a few atoms. In other aspects, the invention provides methods for using the ion microscope to analyze samples and enhancing the performance of a gas field ion source.

Figure 1:
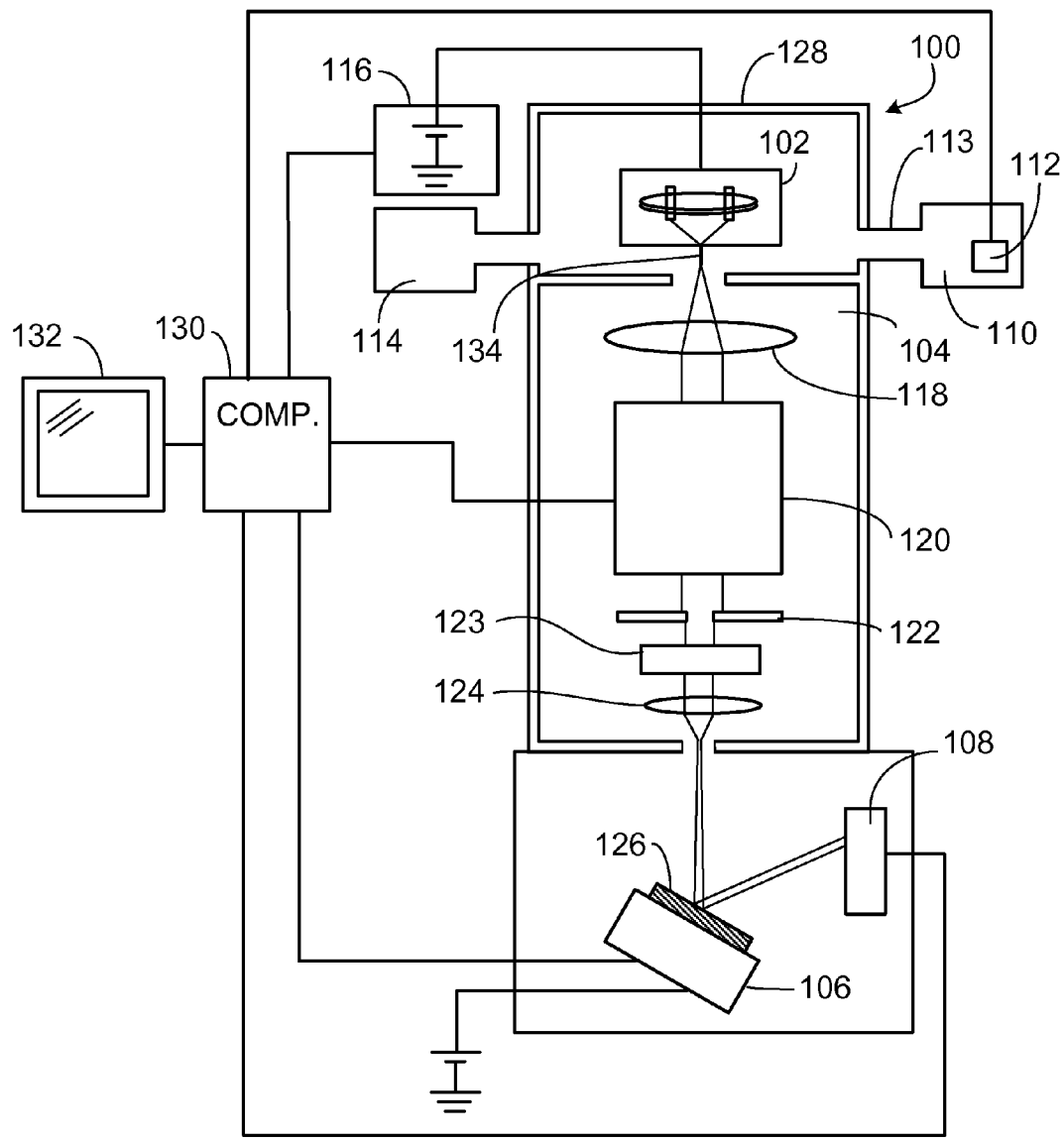
FIG. 1 is a block diagram depicting an ion microscope according to one illustrative embodiment of the invention.

FIG. 1 is a block diagram depicting an ion microscope 100 according to one illustrative embodiment of the invention. The ion microscope 100 includes an ion source 102 having an emitter tip 134, an optical column 104, a sample holder 106 and a detector 108. A gas source 110 having a pressure control module 112 and nozzle 113 is disposed near the ion source 102. A vacuum pump 114 is also disposed near the ion source 102. The ion source 102 is also connected to a voltage source 116. The sample holder 106 is configured to accommodate a sample 126. The detector 108 is disposed near the sample 126. The ion source, optical column, the sample and the detector are enclosed in a vacuum housing 128. A computer 130 is connected to some elements in the microscope including the voltage source 116, pressure control module 112, elements within the optical column 104 and detector 108. The computer may additionally and optionally be connected to the sample holder 106 such that the sample holder may be maneuverable. During operation, the gas source 110 delivers neutral gas atoms of an imaging gas to a region near the emitter tip 134. The imaging gas atoms are ionized and are accelerated away from the emitter 134. The ionized imaging gas atoms constitute an ion beam. This ion beam generated near the emitter tip 134 travels through the length of the optical column 104 towards the sample 126.

In one embodiment, the emitter 134 includes a sharpened piece of wire of a single crystal material. In such an embodiment the emitter 134 may be formed from single-crystal tungsten. The emitter 134 may also be formed from other suitable crystalline materials without departing from the scope of the invention. The emitter 134 typically has a length from about 750 µm to about 5 mm. In one example, the length of the emitter is chosen to be from about 1.5 mm to about 2 mm. The width of the emitter near its widest portion is typically from about 50 µm to about 1 mm. In one example, the width of the emitter near its widest portion is chosen to be about 250 µm. The emitter 134 tip tapers to an atomic shelf having a few atoms.

The emitter 134 is also typically formed from a suitable conductive material such that in response to applying a voltage to it, an electric field is generated around the tip. The emitter 134 is connected to a voltage source 116 having the capability of generating operating voltages greater than 30 kV. The voltage source 116 may be a suitable DC source according to specific needs of the application. In one embodiment, the tapered shape of the emitter 134 is responsible, at least in part, for the electric field to be higher near the tip 108. Generally, the electric field intensity is high at sharp points and the depicted systems describe the tip of the emitter having a countable number of atoms. The system allows for the generation of very high electric fields in the region near the atomic scale tip.

In one example, the emitter 134 is aligned such that its <111> crystal axis is along the axis of the optical column 104. In such an embodiment, the most distal atomic shelf may instead have a single atom and the next lower atomic shelf may have three atoms. A voltage source similar to voltage source 116 may be used to apply a voltage to the emitter 134 such that an electric field is generated around the surface of the emitter 134. In certain embodiments, the single atom on the most distal shelf is released due to the applied electrostatic force. In such an embodiment, the tip of the emitter 134 is left with three atoms ("trimer") as the most distal atomic shelf. The trimer may be used as an ion source capable of generating an ion beam along an axis nearly perpendicular to the plane defined by the trimer. In one embodiment, the emitter 134 may be tilted such that the axis of the emitter 134 is at an angle from the axis of the optical column 104. In such an embodiment, one of the three atoms in the trimer lies on the axis of the ion beam. The emitter 134 may be tilted depending on the requirements of a particular application. For example, in microscopy applications requiring high resolution, it may be desirable to have small spot sizes for the ion beam. In such applications, it may be beneficial to tilt the emitter 134 as described above such that the ion beam is generated from one atom of the trimer. As another example, for some microscopy applications requiring high throughput of ions, it may be desirable to use all the three atoms of the trimer. The throughput of ions is typically known as the beam current which is measured as the rate at which the ions strike the surface of a detector.

In one embodiment, the tip 108 may be cooled to temperature of around −200° C. In another embodiment, the imaging gas may also be cooled prior to being delivered to the region near the distal end 114 of the emitter. In such an embodiment, the imaging gas may be cooled to a temperature of about −200° C.

The gas source 110 includes a connection to a source of imaging gas and a nozzle 113 for pumping the imaging gas to a region near the emitter 134. The nozzle 113 may be oriented such that the imaging gas may be delivered substantially to a region near the tip of the emitter 134. The imaging gas may include at least one of helium, neon, argon, krypton, xenon and hydrogen. In certain embodiments, the gas source may be connected to a plurality of sources for delivering an imaging gas and a promoting gas to a region near the emitter 134. The promoting gas is used to enhance the performance of the ion microscope and sharpen the tip of the emitter 134. In one embodiment, the gas source includes a nozzle 113 having a length about 5 times greater than the diameter. Such an embodiment allows for gas to be delivered to a desired location with minimal spread. The gas source 110 may include valves, timers, gauges, pressure regulators and other suitable control systems to monitor and control the gas pressure near the tip of the emitter.

The vacuum pump 114 may be connected to remove excess gas atoms from the region near the emitter 134. The vacuum pump 114 may be a turbo pump or an ion pump connected through a vacuum hose to the interior of the housing 128.

The housing 128 is typically formed from rigid, electrically conductive materials such as a metal. In one embodiment, the housing 128 may include separate enclosures for each of the ion source 102, the optical column 104 and the sample holder 106 and detector 108. In another embodiment, the housing 128 may include a single enclosure for the ion microscope 100. Housing 128 includes an aperture for introducing gas atoms near the emitter 134. The housing 128 may also include another aperture for removing un-ionized gas atoms. The housing 128 may further include an aperture to allow the gas ions to travel from the ion source 102 to the optical column 104 and to the sample holder 106 and detector 108.

In one embodiment, the housing 128 may be connected to an electrical ground, thereby establishing a voltage difference between the tip of the emitter 134. In another embodiment, an extractor electrode having a connection to an electrical ground may be included within the housing 128, thereby establishing a voltage difference between the tip of the emitter 134. In such an embodiment, the extractor electrode may be formed from an electrically conducting material such as copper. In one embodiment, the extractor electrode may be disc shaped with a hole in the center and located in a position near the tip of emitter 134. In such an embodiment, the disc shaped extractor electrode may have a diameter of about 6 inches and may be located in a position about 2 mm below the tip of emitter 134 such that an ion beam may pass through the center of the disc. The extractor electrode may have different shapes and dimensions and may be positioned in different locations without departing from the scope of the invention.

The optical column 104 includes a first set of lenses 118, a beam alignment section 120, an aperture 122, a scanning and patterning system 123 and a second set of lenses 124. The first set of focusing lenses 118 within the optical column 104 includes at least one electrostatic lens. The electrostatic lens may be capable of accelerating, decelerating, collimating, focusing or deflecting an ion beam generated by an ion source 102 for further processing within the optical column 104. The first focusing lens 118 may include other lenses without departing from the scope of the invention.

The beam alignment optics 120 generally include a set of about 8 electrodes which can direct the ion beam along a specified path along the optical column. The electrodes are typically arranged as a pair of sequential quadrupoles. Alternative plate arrangements such as octupoles may also function similarly. In one embodiment, each quadrupole can deflect the beam in a plurality of combinations of horizontal and vertical directions. The two quadrupoles allow the beam path to be directed so that it can pass through the center of the aperture and the center of the second set of lenses. The controlled beam path can compensate for other factors which may cause the beam to not pass thought the center of the column. Such factors include undesired fields, or mechanical misalignments. The beam alignment optics can also include beam stops so that the beam can be interrupted before it passes through the remainder of the optical column.

In one embodiment, the beam alignment optics can also include devices which limit the passage of certain constituents of the beam. For example, high energy neutrals can be limited by a set of at least 3 deflector pairs. The neutral beam is typically undeflected and is collected in a beam stop. The desired beam is deflected off axis and back on axis to its original path. Such an embodiment, can be used to remove doubly charged ions, or ions having other masses.

The resolution of the ion microscope can be controlled by altering the size of the beam spot. Typically, a smaller beam spot gives a higher resolution. An aperture 122 may be used in the optical column 104, among other things, to control the size of the beam spot. The aperture 122 typically includes a sheet of opaque material with one or more holes. In certain embodiments, the diameter of the hole can be from about 5 µm to about 200 µm.

The optical column 104 also comprises scanning and patterning section 124 having electrostatic plates which are capable deflecting the beam in a direction substantially perpendicular the column axis. The deflection is accomplished in two stages. The first stage deflects the beam off the axis of the optical column 104, and the second stage deflects the beam back towards the axis such that it passes through the axis at a pivot point, and strikes the sample off axis. The voltage applied to the electrostatic plates controlling the deflection can be ramped so that the beam landing position may be a raster pattern. Rastering may also be performed with a single stage of deflection. Rastering is typically done in about two orthogonal directions (named X and Y) so that a rectangular region of the sample may be exposed to the beam. Each stage of deflection can be realized with quadrupoles or octupoles so that a proper selection of voltages produces beam deflection in any combination of the X and Y directions.

The second set of focusing lenses 124 includes at least one electrostatic lens. The electrostatic lens may be capable of accelerating, decelerating and focusing an ion beam onto a sample located near the optical column 104. The second focusing lens 124 may include other lenses without departing from the scope of the invention.

The sample holder 106 is formed from rigid, non-reactive and electrically insulating materials such as glass, polymers and ceramic, though other materials may also be suitable. The sample holder 106 may be sized and shaped to hold suitable samples 126 depending on the requirements of a specific application. The sample holder 106 may be disposed in a position such that a portion of the sample 126 is in the path of the ion beam traveling from the optical column 104.

The detector 108 may include suitable elements capable of detecting a characteristic of particles emitted from the sample 126. The detector 108 is configured to detect particles, including at least one of photons, electrons, ionized particles and neutral particles. In one embodiment, the detector 108 is configured to detect at least one of the rate of particles, particle energy, particle angles, particle polarization and de-excitation time. The detector 108 may include photomultipliers, phosphor screens and scintillating-photomultipliers. In one embodiment, the detector is annular in geometry with the ion beam passing through a central hole. The detector may be chosen to be position sensitive (e.g., a resistive anode detector), such that the detected signal provides an indication of where the detected particle may have struck the detector surface. In one embodiment, the detector is biased with a moderate voltage, e.g., −50V, to limit the number of secondary electrons that are collected, or to limit or eliminate any signal such electrons might generate. The remaining particles which can then strike the detector are typically Rutherford backscattered particles which travel in straight trajectories with high energies. In such an embodiment, topographic information can be encoded in the position of the detected particles.

The system of FIG. 1 also includes a computer 130 and a display 132 for controlling the operation of the ion microscope and monitoring the detected signals. The computer 130 may be used to modify the operating voltage by controlling the voltage source 116. Computer 130 may send control signals to the pressure control module 112 of the gas source 110 to control the gas pressure and thereby control the beam current. Computer 130 may also be used to control the electrostatic and electromagnetic lenses and the aperture 122 of the optical column 104. In certain embodiments, the computer 130 may be used to control a movable sample holder 106 such that a sample 126 may be moved and rotated. Signals detected by the detector 108 may be sent back to the computer 130 for further processing and display on screen 132.

Figure 2:
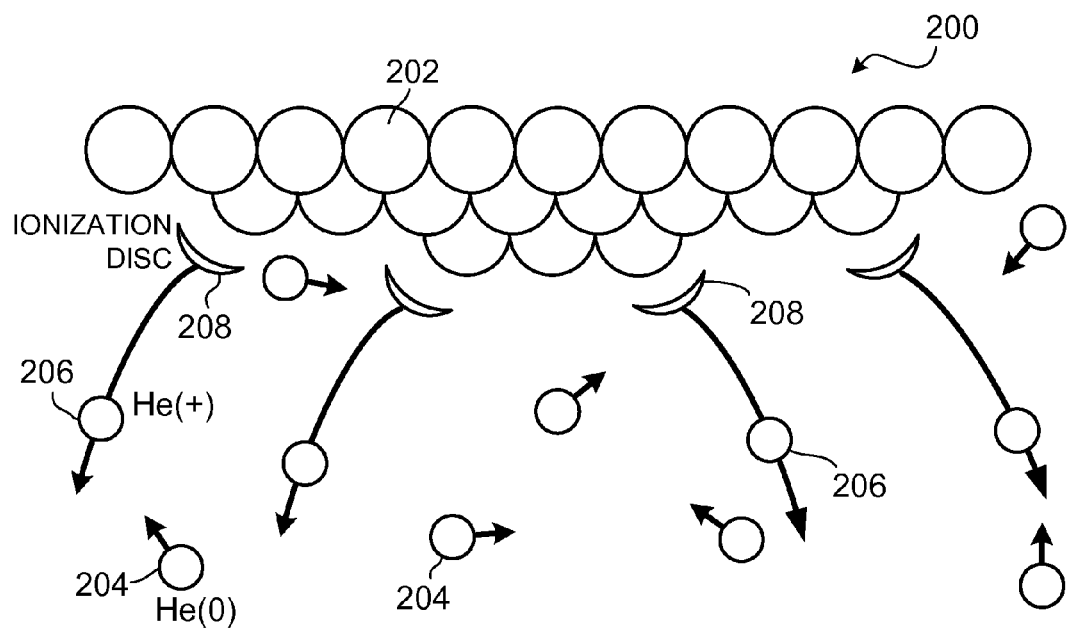
FIG. 2 is a zoomed-in view of a tip of an ion source in an ion microscope according to one illustrative embodiment of the invention.

FIG. 2 is a zoomed-in view of a tip of an ion source in an ion microscope according to one illustrative embodiment of the invention. The tip 200 includes one or more atoms 202 arranged in shelves such that the most distal atomic shelf includes three atoms. Neutral gas atoms 204 delivered by the gas source 110 are shown to be moving near the tip 200 and ionized gas atoms 206 moving in a direction away from the tip 200. A voltage applied to the tip 200 by voltage source 116 generates an electric field such that the neutral gas atoms 204 get polarized and move towards tip 200. The polarized atoms get ionized in an ionization disc 208 near the atoms 202 on the atomic shelves and accelerate away from the tip 200.

The ionization disc 208 is typically a fairly narrow region above the surface of the tip 200 where gas atoms can be ionized. Gas atoms 204 generally have a higher probability of getting ionized the longer the time they spend in the ionization disc 200. Polarized gas atoms hop on the surface of the tip 200 until their velocity is lowered and they spend more time lingering near the ionization disc 208.

In certain embodiments, the ionization disc may be about 0.4 nm above the surface of the most distal atomic shelf. In such embodiments, the ionization disc 208 may have a thickness of about 0.02 nm and width of about the diameter of an atom 202. The size and shape of the ionization disc 208 can be modified by at least changing the voltage applied to the tip 200. In certain embodiments, the ionization discs 208 from adjacent atoms can overlap depending on the applied voltage 200. The emitter 134 in the ion source 102 may be assembled with other support elements to provide stability as well as connectivity to voltage sources and mechanical structural elements.

Figure 3:
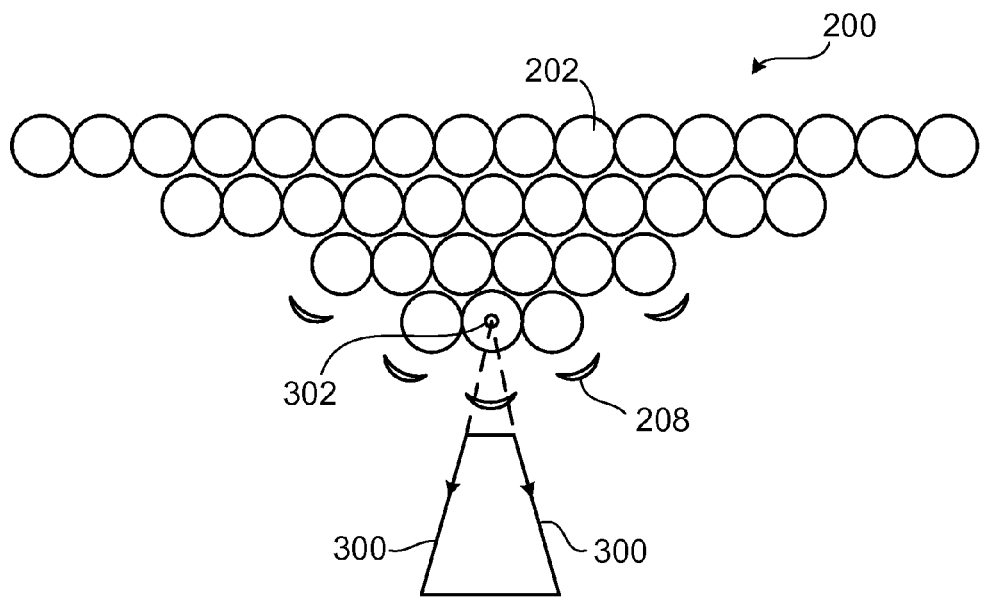
FIG. 3 is a zoomed-in view of a tip of an ion source showing the formation of a virtual source according to one illustrative embodiment of the invention.

FIG. 3 is a zoomed-in view of a tip 200 of an ion source 102 showing the formation of a virtual source according to one illustrative embodiment of the invention. In particular, ionized gas atoms 206 shown in FIG. 2 accelerate away from the tip 200 along a plurality of directions shown by the region defined by arrows 300. The arrows 300 can be extrapolated back towards the tip 200 such that they meet at a virtual source 302. The virtual source 302 is typically smaller than the ionization disc 302 and typically much smaller than the atom 202. The small virtual source 302 allows for minimal demagnification of the ion beam prior to impinging on the sample.

The small virtual source 302 and the thickness of the ionization disc 302 allows for the generation of a high brightness beam having low energy spread. Such a bright and narrow beam allows for larger distances between the second set of lenses 124 and the sample. In one embodiment, the distance from an end of the optical column 104 to the sample 126 is about 50 mm and higher.

Figure 4:
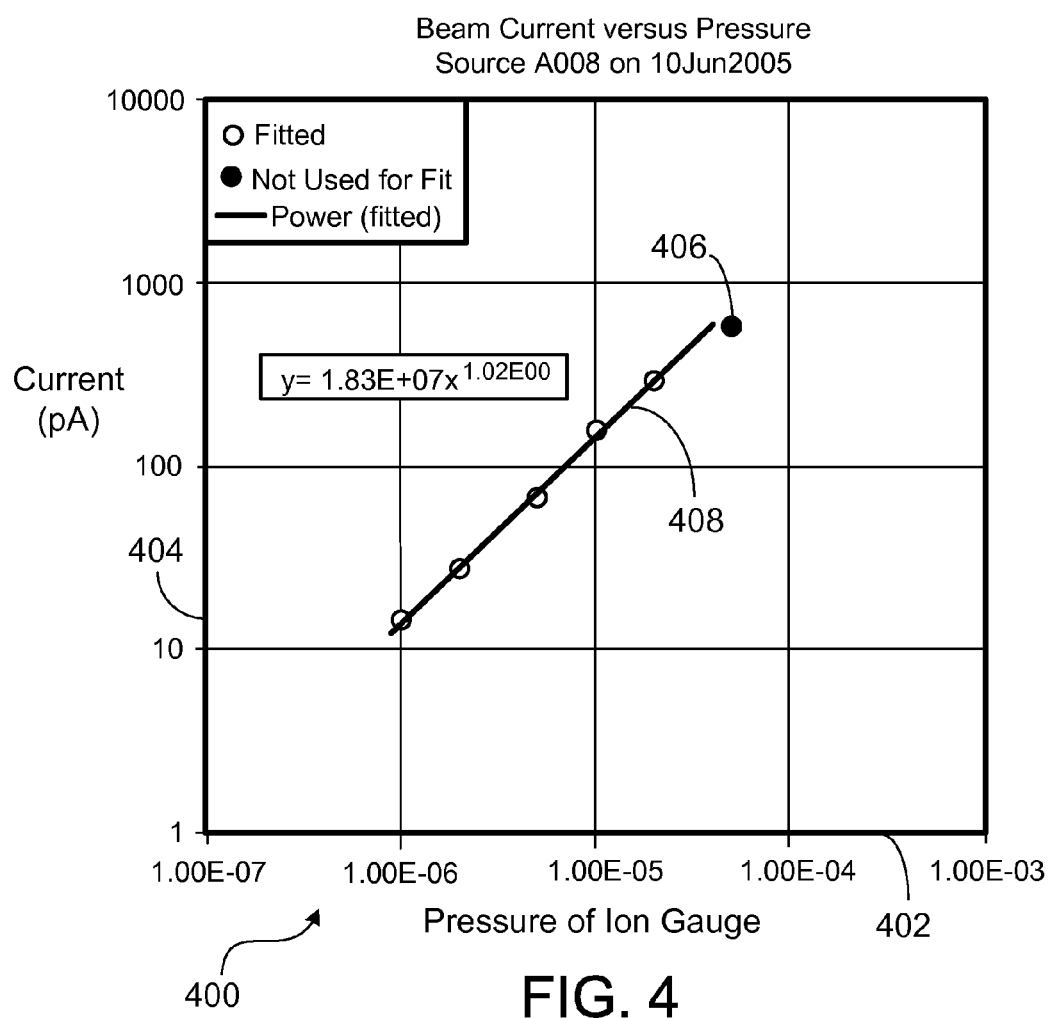
FIG. 4 is a chart showing the relationship between the ion beam current and gas pressure for an ion microscope according to one illustrative embodiment of the invention.

FIG. 4 depicts a chart 400 showing the relationship between the beam current and gas pressure in a log-log scale. The horizontal axis 402 shows the pressure of the ion gauge in Torr. The vertical axis 404 shows the beam current in picoampere. Test data points 406 are shown to be approximately represented by a line 408. In certain embodiments, the chart 400 may be used to adjust the pressure of the gas source 110 of FIG. 1 to obtain particular values of beam current. The chart 400 shows that there is a power law relationship between the pressure of the gas delivered by the gas source and the current of the ion beam. Typically, as pressure is increased, the ion beam current is also increased. The pressure control module 112 of gas source 110 may be used to control the beam current based at least in part on the relationship shown in chart 400.

Figure 5:
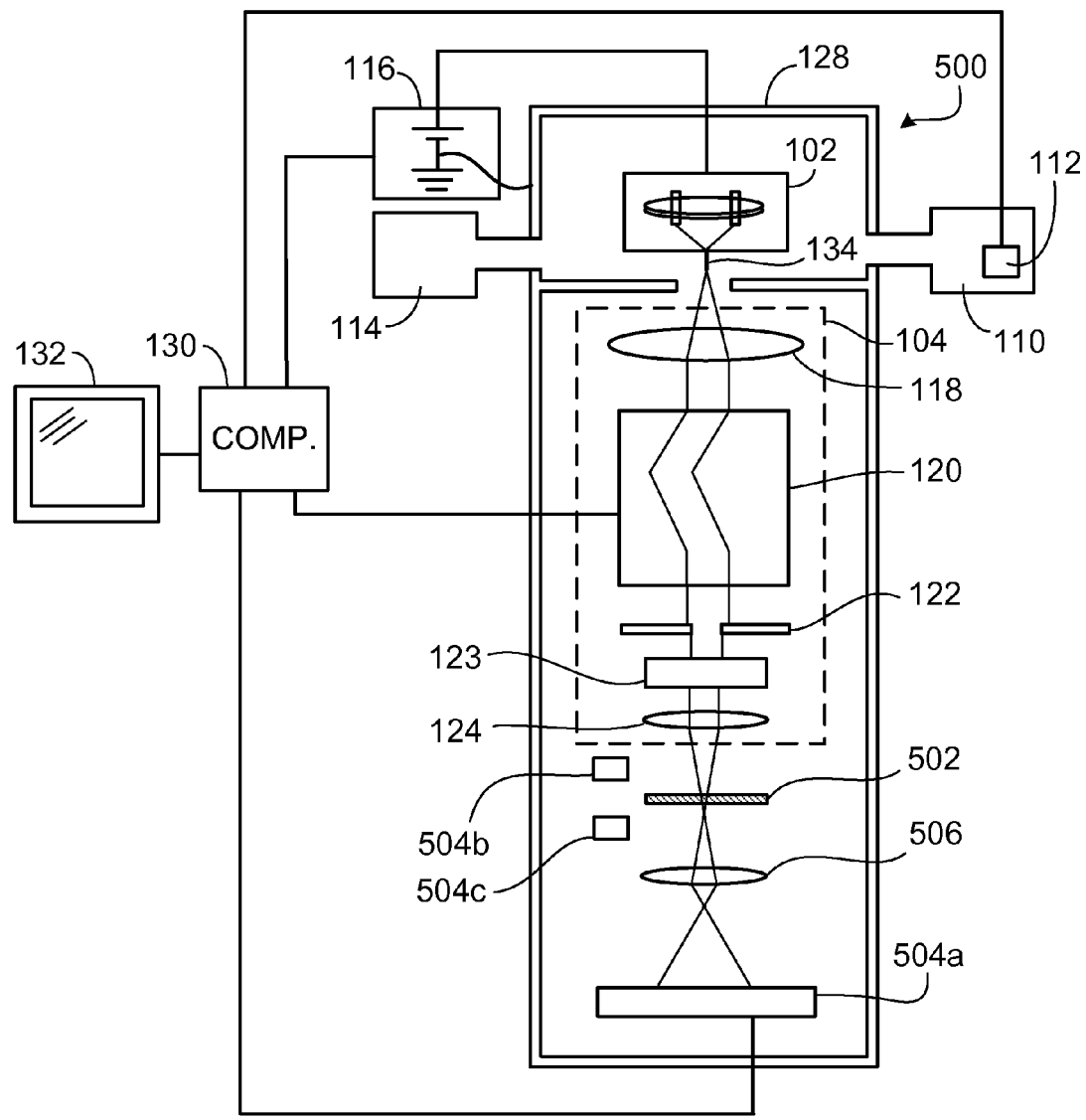
FIG. 5 is a block diagram depicting a transmission ion microscope according to one illustrative embodiment of the invention.

FIG. 5 depicts a transmission ion microscope 500 according to one illustrative embodiment of the invention. The transmission ion microscope 500 includes an ion source 102 having an emitter tip 134, an optical column 104 and a detector 504. A gas source 110 having a pressure control module 112 and nozzle 113 is disposed near the ion source 102. A vacuum pump 114 is also disposed near the ion source 102. The ion source 102 is also connected to a voltage source 116. The optical column 104 includes a first set of lenses 118, a beam alignment section 120, an aperture 122, a scanning and patterning system 123 and a second set of lenses 124. A sample 502 is disposed in the path of an ion beam generated at the ion source 102. The detector 504 is disposed on a side of the sample 502 opposite to the side facing the optical column 104. A third set of lenses 506 may be disposed near the sample 502. The ion source 102, optical column 104, the sample 502 and the detector 504 are enclosed in a vacuum housing 128. A computer 130 is connected to some elements in the microscope including the voltage source 116, pressure control module 112, elements within the optical column 104 and detector 504. In one illustrated embodiment, the sample 502 may be thin such that an ion beam impinging on a side of the sample 502 facing the optical column may penetrate through the sample 502 and travel toward the detector 504a. In another embodiment, detectors 504b and 504c may be located above and below a sample 502 such that particles such as secondary electrons, scattered ions and dislodged lighter-than-helium atoms may be detected. Such an embodiment may be used in a Transmission Ion Microscopes (TIM) and Scanning Transmission Ion Microscopes (STIM).

Figure 6:
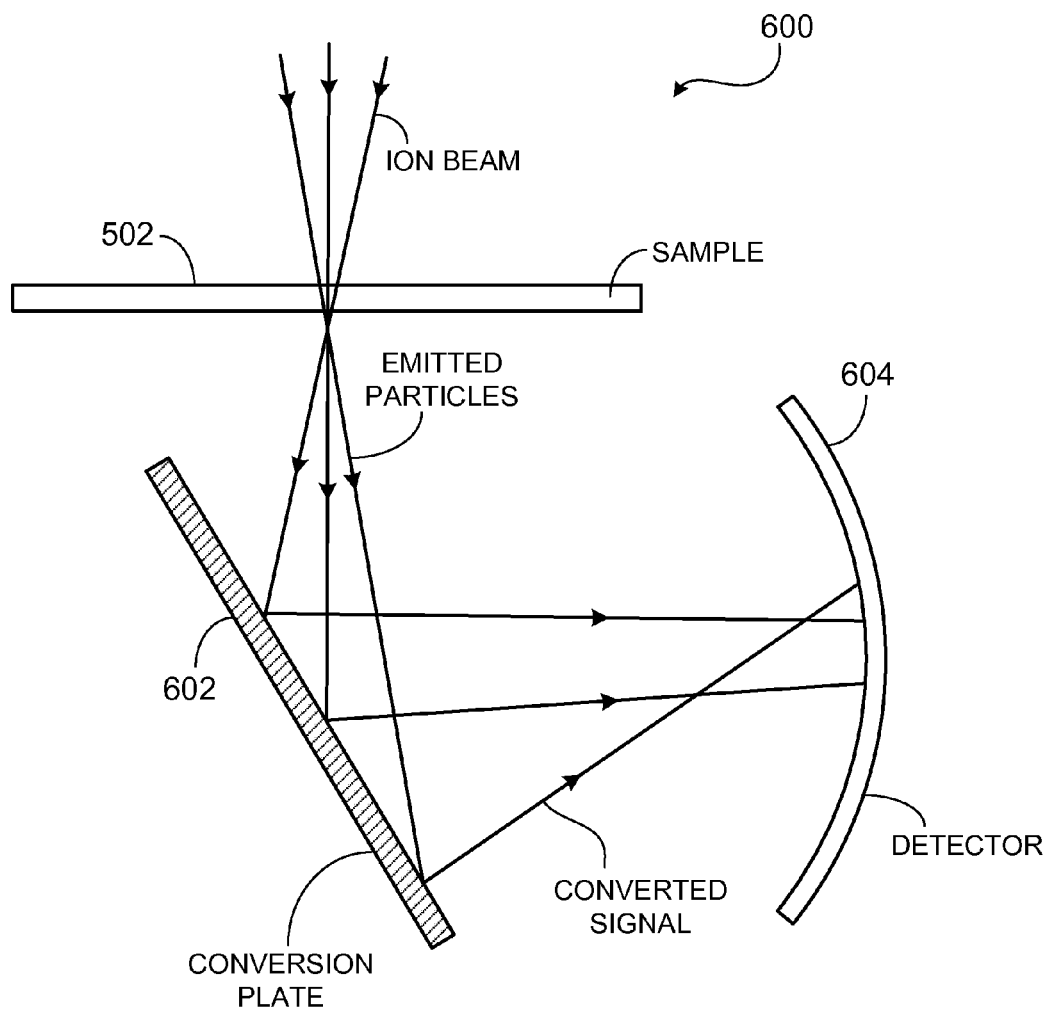
FIG. 6 depicts a conversion plate configured with an ion microscope according to one illustrative embodiment of the invention.

FIG. 6 depicts a conversion plate configured with an ion microscope according to one illustrative embodiment of the invention. In particular, the assembly 600 shown in FIG. 6 includes a sample 502, a conversion plate 602 and a detector 604. In one embodiment, in response to an impinging ion beam, the sample emits particles toward the conversion plate 602. The conversion plate 602 is configured such that it emits a second set of particles in response to the particles emitted from the sample. In one embodiment, the conversion plate 602 may be formed from a bulk material including titanium. In one embodiment, the conversion plate 602 may be formed from materials having a high conversion efficiency of ions to secondary electrons. The conversion plate 602 may also be coated with a material that can produce a high yield for an incident particle of interest. In one embodiment, the conversion plate 602 may be coated with a thin layer of magnesium oxide. In certain embodiments, the conversion plate can be shaped for a subset of the particles emitted from the sample 502. The conversion plate 602 may also be configured with a detector 604 such as an annular detector to reject transmitted ions and ions scattered to sufficiently small angles.

Figure 7:
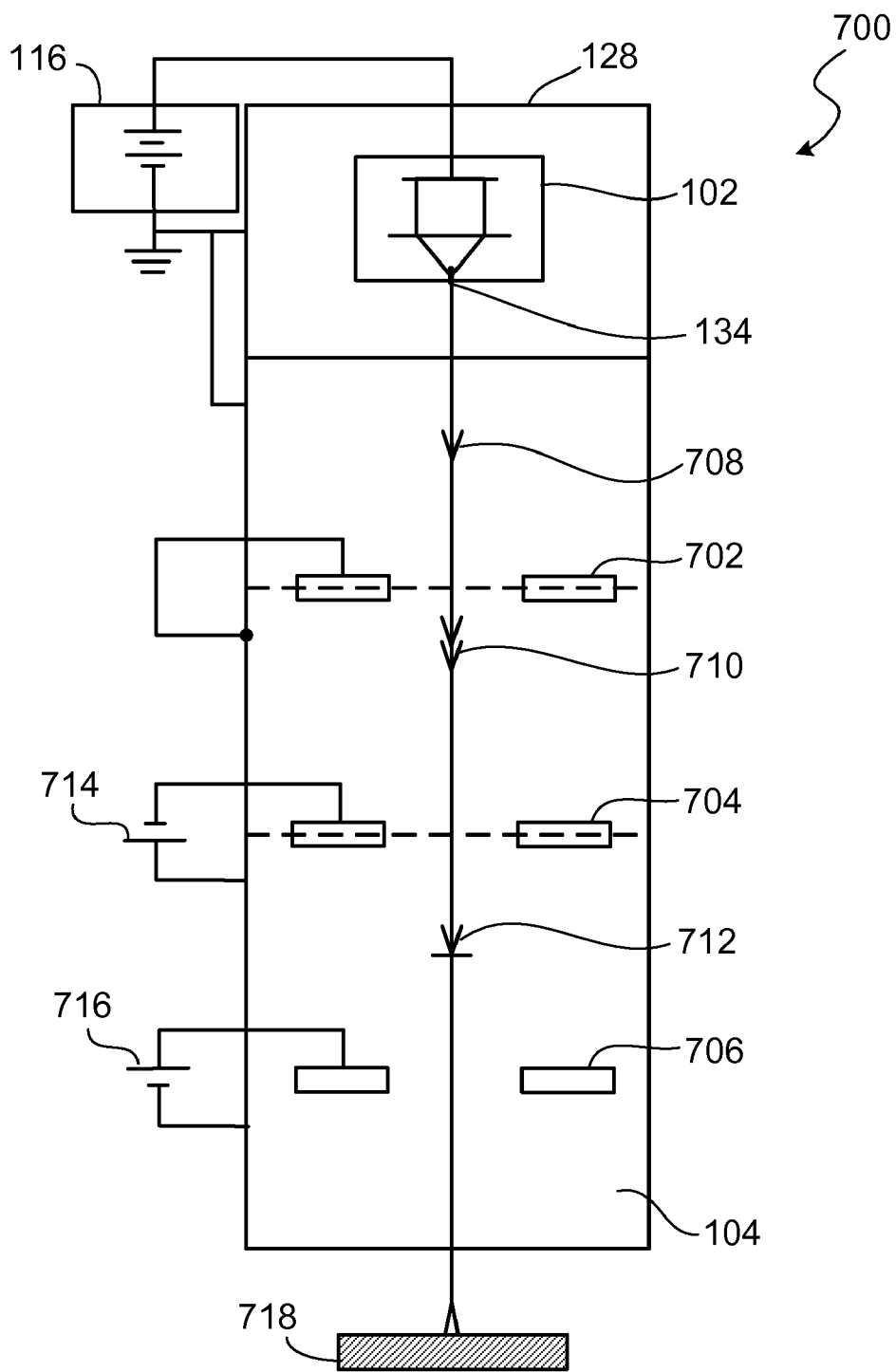
FIG. 7 is a block diagram depicting the acceleration and deceleration of an ion beam in an ion microscope according to one illustrative embodiment of the invention.

FIG. 7 is a block diagram depicting the acceleration and deceleration of an ion beam in an ion microscope according to one illustrative embodiment of the invention. In particular, FIG. 7 shows an ion microscope 700 including an ion source 102 having an emitter 134, an optical column 104 and a voltage source 116. A sample 718 is disposed in the path of the ion beam. According to one illustrative embodiment, the ion beam generated at the emitter 134 travels through the optical column 104 towards the sample 718. The ion microscope 700 includes a series of electrodes 702, 704 and 706 placed at different locations along the optical column 104. The electrodes 702, 704 and 706 may be used to accelerate and/or decelerate the ion beam prior to impinging on the sample 718. In one embodiment, the ion beam may be accelerated and/or decelerated in a location between the emitter 134 and the first set of lenses 118. In another embodiment, the ion beam may be accelerated and/or decelerated in a location between the second set of lenses 124 and the sample 718. In still another embodiment, the ion beam may be accelerated and/or decelerated in a location near the second set of lenses 124.

An ion beam 708 may initially travel through the optical column 104 with a kinetic energy dependent on the operating voltage of the voltage source 116. For example, the voltage source 116 may supply a voltage of about 25 kV to a helium ion source. In such an example, the helium ion beam particles may have an energy of about 25 keV. In one embodiment, the electrode 704 may be connected to a reverse polarity voltage source thereby increasing the potential difference between the ion source and the electrode 704. In such an embodiment, the ion beam 710 with a direction shown by double arrows may have a higher kinetic energy. In one embodiment, the electrode 706 may be connected to a voltage source having a voltage higher than electrode 704 and 702 thereby decreasing the potential difference between the ion source and the electrode 706. In such an embodiment, the ion beam 712 with a direction shown by a single arrow and bar may have a lower kinetic energy. Optical column 104 shown in FIG. 7 may also include other optical elements similar to FIGS. 1 and 5.

In one embodiment, an ion beam may be extracted from the emitter 134 at low energy (e.g., restrictions based on ion source geometry) and accelerated so that it travels with a higher energy within the optical column 104 to reduce space charge effects. The ion beam may then be accelerated or decelerated such that it may hit the sample 718 with a desired landing energy depending on the nature of the sample and desired imaging conditions.

The systems and methods described herein include systems and methods that employ back scattered ions to generate an image of the sample. In one embodiment, the systems and methods described herein employ a focused ion beam having a beam diameter of approximately less than a hundred nanometers. In one particular embodiment, the system employs a Helium ion beam that may be focused to a spot size of less than 10 nanometers in certain practices, less than one nanometer in certain other practices and at about 0.25 nm in still certain other practices. The beam energy may vary according to the application, but in certain preferred practices the beam energy is at or about 0.1-500 v, and in certain other practices the beam energy is between 5-1000 kv.

The tight spot size of the beam provides for high spatial resolution Rutherford Backscattering imaging. Rutherford Backscattering (RB) is based on collisions between atomic nuclei. As know in the art, RBS imaging involves measuring the number, the angle, and energy of ions in a beam which backscatter after colliding with atoms in the near-surface region of a sample at which the beam has been targeted. With this information, it is possible to determine atomic mass and elemental concentrations versus depth below the surface.

In the systems described herein, an ion beam is directed at a sample, such that some of the ions are deflected by the nuclei of the atoms in the sample, causing them to recoil, as part of Rutherford backscattering. In this invention, the imaging signal is chosen to be based on the ions from the incident beam which are scattered from the sample. The energy of the scattered ions depends on their incident energy as well as the mass of the sample atom they hit, and therefore provides information about the chemical composition of the sample. Additionally, the angle of deflection of a scattered ion provides information about the location in the sample from which it was deflected. Together, the angle and energy of the scattered ions provide unique quantitative information about the elemental composition of the sample, which is used to produce an image of the sample.

Part of the RBS effect includes forward scattering of the ions: if the sample is thin enough, the scattered ions, optionally, can be measured on the opposite side of the sample as well. Thus, the angle of deflection of an ion from the ion beam can range from 0 degrees (technically this is forward scattering) to 180 degrees (true backscattering).

Figure 8:
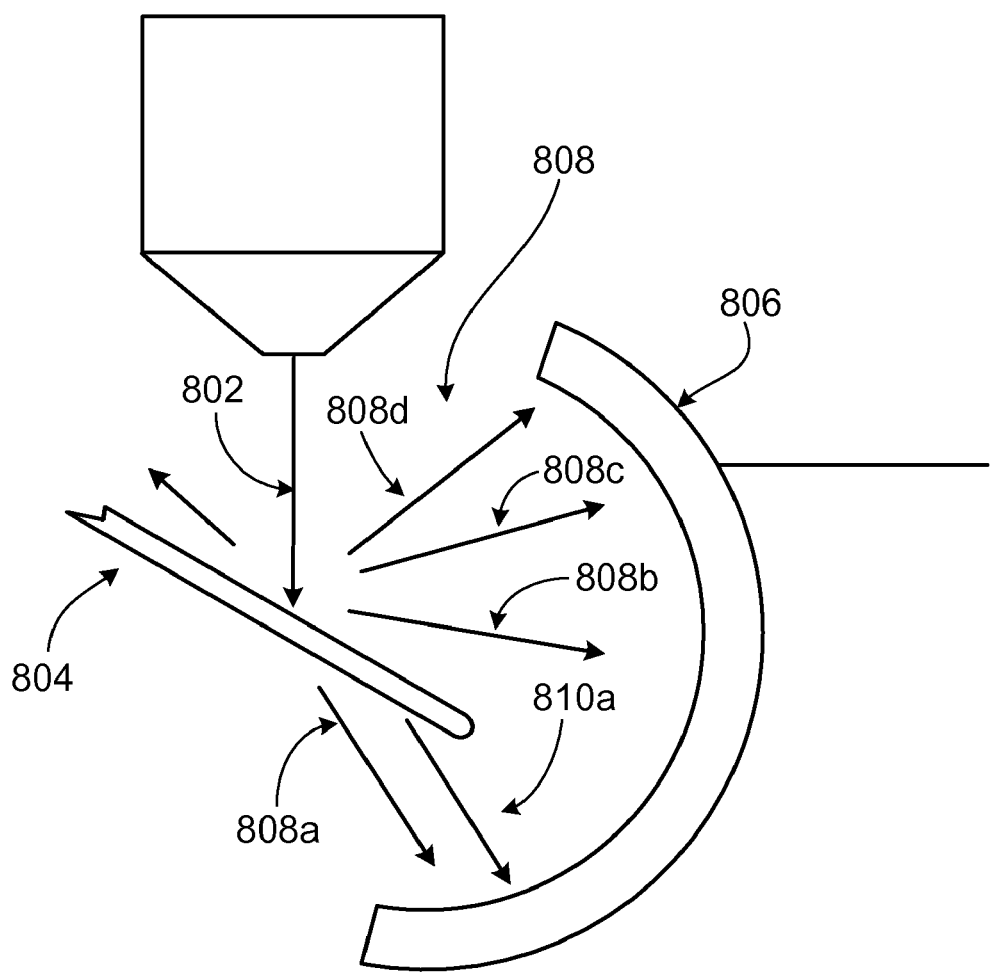
FIG. 8 is a schematic representation of a portion of an ion microscope.

As shown in FIG. 8, an incident ion beam 802 is directed at a sample 804. In one embodiment the ion beam 802 is a beam of Helium (He) ions. However, in other embodiments the systems described herein may comprise a beam of Neon ions, Argon ions and other ion sources, such as an LMIS source, may also be used without departing from the scope of the invention. Helium has an advantage over other elements as it causes minimal or reduced damage as compared to heavier elemental sources. One suitable embodiment has a gas field ion source (GFIS) as described in "Ion Sources for Nanofabrication and High Resolution Lithography", J. Melgnailis, IEEE Proceedings of the 2001 Particle Accelerator Conference, Chicago, Ill. (2002), the contents of which are incorporated herein by reference. See, also "Growth and Current Charities of a Stable Field Ion Emitter," K. Jousten et al., Ultramicroscope 26, pp. 301-312 (1988) and "Maskless, Resistless Ion Beam Lithography Process," Qing Ji, Ph.D. Dissertation, Department of Electrical Engineering and Computer Sciences, University of California, Berkeley (2003); and Quest for high brightness, monochromatic noble gas ion sources, V. N. Tondare. A 23(6), November/December 2005 J. American Vacuum Society. These sources provide high brightness and small source size.

The depicted sample 804 may be a semiconductor device, a biological sample, or any other suitable sample. In one experiment, the sample 704 is a thin silicon substrate of the type used in semiconductor devices and having a thickness of about 10 nanometers. The thickness is selected to allow for a He ion source having a tightly focused spot size to deliver ions that can pass through the sample 804. This allows for forward scattering to be used as part of the imaging process. This is shown in FIG. 1, by the ions in the beam 808 that pass through the sample 804 and are collected/detected by the detector 806. The energy and angle of the scattering substrate atoms 810 may also be employed to determine the elemental composition of respective scattered substrate atoms.

A detector 806 can be constructed to measure the energy and angle of the scattered ions 808 either after they pass through the sample 804, such as scattered ion 808*a*, or after they are deflected from it, such as scattered ions 808*b-d*. The analysis of the energy spectrum then provides quantitative elemental and isotopic information. This technique has been successfully used to visualize low atomic number materials and possibly sub-nanometer size materials. Additionally, RBS imaging enables visualization of light substances such as photoresist. Note that for sufficiently light nuclei targets, it is possible to do the same energy and angle analysis of the struck nuclei since these will usually be liberated from the surface. In the embodiment depicted in FIG. 1, the detector 806 may be a micro-channel plate that measures the total abundance of backscattered ions. An optional energy selective filter may be used that can be swept across a range of energies to measure the energy spectrum and allow for determining the elemental information. In other embodiments, the detector 806 may be tuned for a particular energy or energies of interest, thereby allowing the detection of certain elementals. The choice of detector will vary with the application.

In an alternative method, RBS imaging is done qualitatively, simply by using the overall measure of the RBS ions—the total abundance of ions—as the signal. For example, the microchannel plate can receive the backscattered ions and a phosphorous screen disposed adjacent the plate, will illuminate in response to the plate being stimulated. The results provide angular information about the scatter for each pixel element in the images to create an image of the sample 804. An image can now be formed whose grey scale can be modulate as a function of the angle and total abundance of ions scattered from each pixel element. This provides an image whose grey scale indicates the scattering probability and depth. This method is useful for recognizing regions of differing material composition. This method could also be used for recognizing different topographical features and their directionality on the surface of the sample.

One advantage of RBS imaging is that, unlike images produced by SE imaging, the RBS images are immune to typical sample charging artifacts due to their relatively high energy the surface charge. Also, the RBS images provide sub-surface information. In particular, RBS imaging is well suited to explore the elements under the surface of a sample, and in particular a thin film sample where the RBS imaging is employed to determine the heavier elements in the thin film. The depth of the sub-surface information can be controlled by changing the energy of the incident ion beam. The RBS images also provide crystallographic information by virtue of how the penetration depth varies with incident angle relative to the crystal axis. The ability to discriminate sample materials based on the energy of the recoil will be enhanced by choosing an ion beam with a slightly lesser mass than the sample elements. For example, to best discriminate Oxygen, Carbon, and Aluminum, a Helium ion beam may be ideal. To best discriminate between Copper and Nickel, an Argon ion beam may be best.

In yet another embodiment the RBS detector will be located up inside the optical system. In this mode of operation the RBS ions will go back into the optical system's last orifice that which the primary beam traveled from. Once inside of the optical system they will be detected by a charged particle detector that may or may not have the ability to analyze said RBS energy. This concept may have certain advantages including higher energy resolution and shorter working distance, this shorter working distance provides for smaller primary beam sizes by the process of optical de-magnification via the lower lens. The combination of shorter working distance and in-the-optics-detector (not shown but available in alternate embodiments) may allow for higher spatial resolution of different upper surface chemicals by utilizing lower primary ion energies which will not penetrate the surface as deep as higher energy primary beams.

RBS imaging could be used with any imaging technique that results in RBS. For example, RBS imaging works effectively in conjunction with an atomic level ion source ion column. This column provides a built in FIM (Field Ion Microscopy) for imaging the source and an ion column to focus and scan the ions. The very small source size allows for lateral resolution at the angstrom level. Also the ALIS ion column allows for small spot size even with a long working distance, so there is ample room for energy and angle sensitive detectors. The working distance may range from 1 mm to 10 inches, thereby providing a substantial amount of useful space through which the sample may be accessed.

Figure 9:
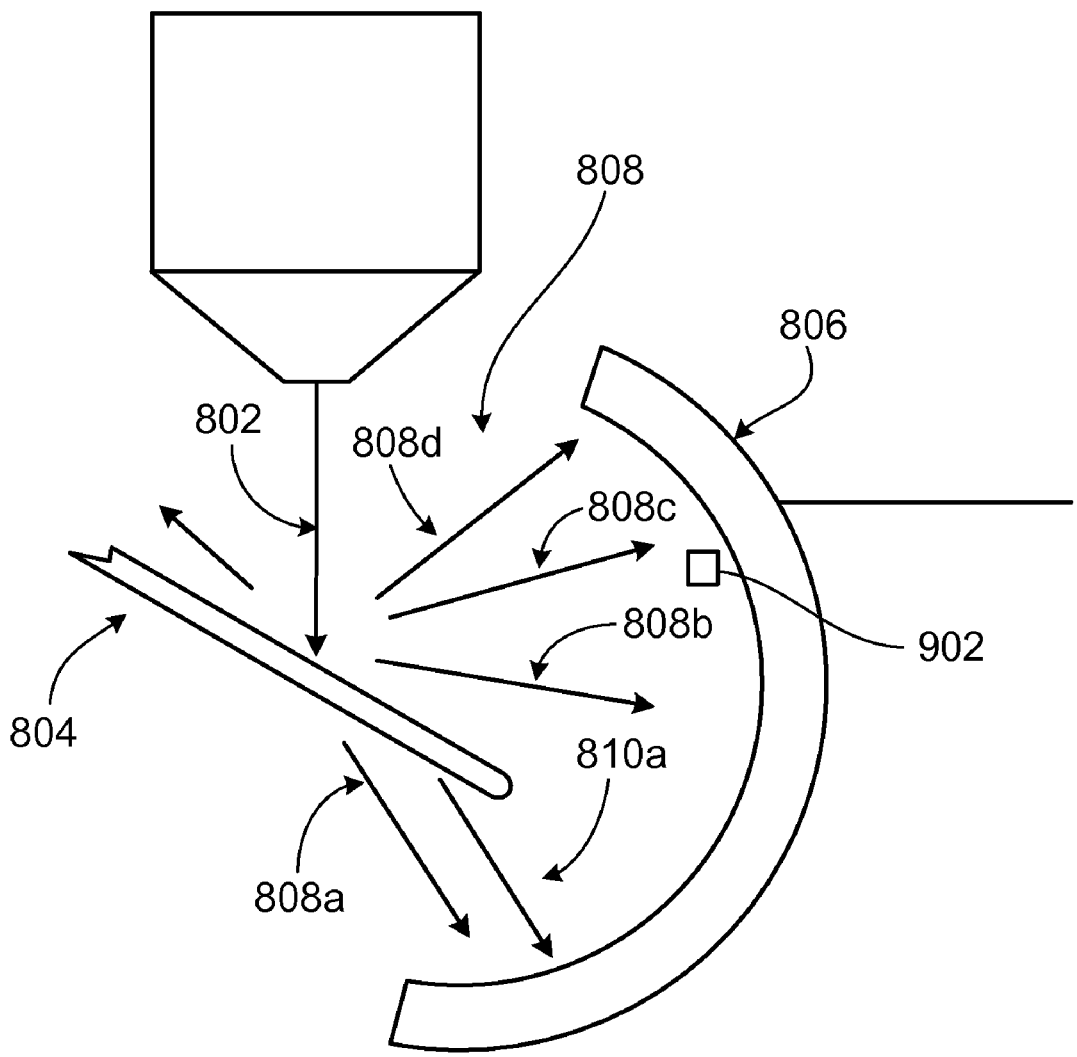
FIG. 9 is a schematic representation of a portion of an ion microscope including an energy selective filter

FIG. 9 is a schematic representation of a portion of an ion microscope 900 that includes an energy selective filter 902 between sample 804 and detector 806.

Those skilled in the art will know or be able to ascertain using no more than routine experimentation, many equivalents to the embodiments and practices described herein. Accordingly, it will be understood that the invention is not to be limited to the embodiments disclosed herein, but is to be understood from the following claims, which are to be interpreted as broadly as allowed under the law.

The invention claimed is:

1. A system, comprising
    a gas field ion source capable of generating an ion beam,
    a detector configured to detect particles emitted from a sample in response to the ion beam, and
    an optical column between the gas field ion source and the sample along a path of the ion beam,
    wherein the detector is configured to determine an energy of the particles, the detector is configured to determine an angle of the particles relative to the sample, and the system is an ion microscope.

2. The system of claim 1, further comprising a gas source capable of delivering a gas to a region near the gas field ion source.

3. The system of claim 2, wherein the gas source is configured to deliver gas at a predetermined pressure and comprises an input module capable of receiving instructions to change the predetermined pressure.

4. The system of claim 1, comprising a conversion plate disposed near a sample holder such that the particles emitted from the sample strike a portion of the conversion plate and wherein the conversion plate is capable of emitting a second set of particles in response to the particles emitted from the sample.

5. The system of claim 1, further comprising the sample, wherein the distance from an end of the optical column to the sample is greater than 50 mm.

6. The system of claim 1, wherein the optical column includes electrodes placed at one or more locations between the gas field ion source and the sample such that the ion beam is accelerated and/or decelerated.

7. The system of claim 1, wherein the detector is configured so that at least some of the particles are detected by the detector after the particles are scattered by the sample.

8. A method, comprising:
    providing an ion microscope, comprising:
        a gas field ion source configured to generate an ion beam,
        a detector configured to detect particles emitted from a sample in response to the ion beam, and an optical column between the gas field ion source and the sample along a path of the ion beam, operating the ion microscope such that the ion beam strikes a portion of a surface of the sample and particles are emitted from the sample, determining an energy of the particles emitted from the sample, and determining an angle of the particles emitted from the sample relative to the sample.

9. The method of claim 8, wherein the ion microscope comprises a gas source capable of delivering a gas to a region near the gas field ion source.

10. The method of claim 9, wherein an intensity of the ion beam is adjusted based at least in part on a concentration of gas in the region near the gas field ion source.

11. The method of claim 8, wherein the ion microscope comprises a conversion plate disposed near a sample holder and detecting includes detecting a second set of particles emitted from the conversion plate such that a characteristic of particles emitted from the sample in response to the ion beam is modified.

12. The method of claim 8, wherein the particles emitted from the sample include at least one of photons, electrons, ionized particles and neutral particles.

13. The method of claim 8, wherein the ion beam is accelerated and/or decelerated.

14. The method of claim 8, wherein the particles emitted from the sample comprise particles scattered from the sample.

15. A system, comprising:

a gas field ion source configured to generate ions;

ion optics configured to direct the ions toward a sample; and a detector configured to detect particles from the sample, the particles being caused by the interaction of the ions with the sample, wherein the detector is tunable so that it can detect particles of different energies to determine elemental information about the sample.

16. The system of claim 15, wherein the detector is configured to detect particles scattered from the sample.

17. A system, comprising:

a gas field ion source configured to generate ions;

ion optics configured to direct the ions toward a sample;

a detector configured to detect particles from the sample, the particles being caused by the interaction of the ions with the sample; and an energy selective filter disposed between the sample and the detector along a path of the particles, wherein the ion optics comprise electrodes placed at one or more locations between the gas field ion source and the sample.

18. The system of claim 17, wherein the detector is configured to detect particles scattered from the sample.

19. A system, comprising:

a gas field ion source configured to generate ions;

ion optics configured to direct the ions toward a sample; and a detector configured to detect particles from the sample, the particles being caused by the interaction of the ions with the sample, wherein the detector is configured to determine an energy of the particles, and the detector is configured to determine an angle of the particles relative to the sample.

* * * * *

UNITED STATES PATENT AND TRADEMARK OFFICE
CERTIFICATE OF CORRECTION

PATENT NO. : 7,601,953 B2
APPLICATION NO. : 11/385215
DATED : October 13, 2009
INVENTOR(S) : Billy W. Ward et al.

It is certified that error appears in the above-identified patent and that said Letters Patent is hereby corrected as shown below:

Title pg, Item (56) Ref Cited, Page 2, Column 1, Line 47, delete "250/423 R" insert --250/423.00 R--.

Title pg, Item (56) Ref Cited, Page 2, Column 2, Line 38, delete "Abastract" insert --Abstract--.

Title pg, Item (56) Ref Cited, Page 2, Column 2, Line 30, delete "Illinoise" insert --Illinois--.

Title pg, Item (56) Ref Cited, Page 3, Column 1, Line 8-9, delete "Tehcnology" insert --Technology--.

Title pg, Item (56) Ref Cited, Page 3, Column 1, Line 35, delete "Research" insert --Research,--.

Title pg, Item (56) Ref Cited, Page 3, Column 1, Line 44, delete "Intruments" insert --Instruments--.

Title pg, Item (56) Ref Cited, Page 3, Column 1, Line 48, delete "J.Vac.Sci.Technol.," insert --J. Vac. Sci. Technol.,--.

Title pg, Item (56) Ref Cited, Page 3, Column 1, Line 60, delete "Muclear" insert --Nuclear--.

Title pg, Item (56) Ref Cited, Page 3, Column 1, Line 64, delete "MeV,"Institute" insert --MeV, "Institute--.

Title pg, Item (56) Ref Cited, Page 3, Column 2, Line 32, delete "Electon" insert --Electron--.

Title pg, Item (56) Ref Cited, Page 3, Column 2, Line 36, delete "Imagin" insert --Imaging--.

UNITED STATES PATENT AND TRADEMARK OFFICE
CERTIFICATE OF CORRECTION

| | |
|---|---|
| PATENT NO. | : 7,601,953 B2 |
| APPLICATION NO. | : 11/385215 |
| DATED | : October 13, 2009 |
| INVENTOR(S) | : Billy W. Ward et al. |

It is certified that error appears in the above-identified patent and that said Letters Patent is hereby corrected as shown below:

Column 3, Line 22, delete "filter" insert --filter.--.

Signed and Sealed this

Fifteenth Day of December, 2009

David J. Kappos
*Director of the United States Patent and Trademark Office*